(12) United States Patent
Kim et al.

(10) Patent No.: US 12,356,611 B2
(45) Date of Patent: Jul. 8, 2025

(54) SEMICONDUCTOR DEVICE AND METHOD FOR FABRICATING THE SAME

(71) Applicant: SK hynix Inc., Gyeonggi-do (KR)

(72) Inventors: Sung Soo Kim, Gyeonggi-do (KR); Woon Seob Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 62 days.

(21) Appl. No.: 18/537,244

(22) Filed: Dec. 12, 2023

(65) Prior Publication Data

US 2024/0114681 A1    Apr. 4, 2024

Related U.S. Application Data

(63) Continuation of application No. 17/403,181, filed on Aug. 16, 2021, now Pat. No. 11,882,694.

(30) Foreign Application Priority Data

Sep. 23, 2020 (KR) .................. 10-2020-0122841

(51) Int. Cl.
*H10B 12/00* (2023.01)
*H01L 21/768* (2006.01)
(Continued)

(52) U.S. Cl.
CPC ....... *H10B 12/50* (2023.02); *H01L 21/76805* (2013.01); *H01L 21/76895* (2013.01); *H01L 21/76898* (2013.01); *H01L 23/481* (2013.01); *H01L 23/53228* (2013.01); *H01L 23/53257* (2013.01); *H01L 23/535* (2013.01);
(Continued)

(58) Field of Classification Search
CPC ...... H10B 12/50; H10B 12/09; H10B 12/315; H10B 12/34; H10B 12/30; H01L 21/76805; H01L 21/76895; H01L 21/76898; H01L 21/76816; H01L 21/76879; H01L 23/481; H01L 23/53228; H01L 23/53257; H01L 23/535; H01L 23/485; H01L 23/5226; H01L 23/5283
See application file for complete search history.

(56) References Cited

U.S. PATENT DOCUMENTS

2006/0086961 A1* 4/2006 Iijima .................... H10D 1/042
 257/303
2006/0255386 A1* 11/2006 Ueda ................. H01L 21/31116
 257/E21.252

(Continued)

OTHER PUBLICATIONS

Office Action on Korean Patent Application No. 10-2020-0122841 issued by the Korean Patent Office on Jun. 14, 2024.

*Primary Examiner* — Sue A Purvis
*Assistant Examiner* — Vicki B. Booker
(74) *Attorney, Agent, or Firm* — IP & T GROUP LLP

(57) ABSTRACT

A semiconductor device includes: an inter-layer dielectric layer over a substrate including a cell region, a first peripheral region, and a second peripheral region; a capping layer over the inter-layer dielectric layer; a capacitor capped by the inter-layer dielectric layer in the cell region; a contact plug penetrating the inter-layer dielectric layer in the first peripheral region; a metal interconnection formed over the contact plug through the capping layer; and a through electrode penetrating the capping layer and the inter-layer dielectric layer and extending into the substrate in the second peripheral region.

9 Claims, 10 Drawing Sheets

(51) Int. Cl.
  *H01L 23/48*  (2006.01)
  *H01L 23/532*  (2006.01)
  *H01L 23/535*  (2006.01)

(52) U.S. Cl.
  CPC ........... *H10B 12/09* (2023.02); *H10B 12/315* (2023.02); *H10B 12/34* (2023.02)

(56) References Cited

U.S. PATENT DOCUMENTS

2007/0272963 A1* 11/2007 Kishida ................ H10B 12/033
                                                                              438/243
2010/0221889 A1    9/2010 Youn
2014/0210087 A1*  7/2014 Kang .................... H01L 23/532
                                                                              257/774
2020/0212169 A1   7/2020 Kim
2022/0157726 A1*  5/2022 Lee ....................... H10B 43/40

* cited by examiner

SEMICONDUCTOR DEVICE AND METHOD FOR FABRICATING THE SAME

CROSS-REFERENCE TO RELATED APPLICATIONS

The present application is a continuation of U.S. patent application Ser. No. 17/403,181 filed on Aug. 16, 2021, which claims priority of Korean Patent Application No. 10-2020-0122841, filed on Sep. 23, 2020, which is incorporated herein by reference in its entirety.

BACKGROUND

1. Field

Various embodiments of the present invention relate to a semiconductor device and a method for fabricating the same and, more particularly, to a semiconductor device having a capping layer, a metal interconnection and a through electrode. Various embodiments of the present invention relate also to a method for fabricating the semiconductor device.

2. Description of the Related Art

As the degree of integration of semiconductor devices increases, the area available for metal interconnections and dielectric material used between the metal interconnections is decreasing. Accordingly, to ensure proper operation and reduce the likelihood of faulty devices due to dielectric material defects, improved techniques are needed. Although, various techniques have been proposed, further improvements are needed.

SUMMARY

Various embodiments of the present invention are directed to a semiconductor device having a capping layer and a sacrificial layer capable of reducing process defects and improving device quality. Various other embodiments of the present invention are directed to a method for fabricating the inventive semiconductor device.

In accordance with an embodiment of the present invention, a semiconductor device includes: an inter-layer dielectric layer over a substrate including a cell region, a first peripheral region, and a second peripheral region; a capping layer over the inter-layer dielectric layer; a capacitor capped by the inter-layer dielectric layer in the cell region; a contact plug penetrating the inter-layer dielectric layer in the first peripheral region; a metal interconnection formed over the contact plug through the capping layer; and a through electrode penetrating the capping layer and the inter-layer dielectric layer and extending into the substrate in the second peripheral region.

In accordance with another embodiment of the present invention, a method for fabricating a semiconductor device includes: forming a contact plug that penetrates an inter-layer dielectric layer over a substrate; forming a capping layer over the inter-layer dielectric layer and the contact plug; forming a trench that exposes an upper surface of the contact plug by etching the capping layer; forming a sacrificial layer that fills the trench over the capping layer; forming a through hole that penetrates the inter-layer dielectric layer, the capping layer, and the sacrificial layer and extends into the substrate; removing the sacrificial layer to expose the trench; forming a metal interconnection in the trench; and forming a through electrode in the through hole.

These and other features and advantages of the present invention will become better understood by those with ordinary skill in the art of the present invention from the following figures and detailed description.

DETAILED DESCRIPTION

Figure 1:
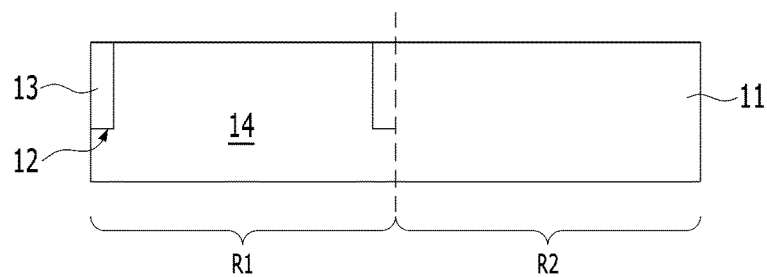
FIGS. 1 to 17 represent one example of a method for fabricating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinafter, embodiments of the present invention will be described in detail with reference to the drawings. Although the description has been made with reference to a Dynamic Random-Access Memory (DRAM) for simplicity in description, the inventive concept is not limited thereto, and may be applied to other memories or semiconductor devices.

FIGS. 1 to 17 represent one example of a method for fabricating a semiconductor device in accordance with an embodiment of the present invention.

Referring to FIG. 1, a substrate 11 may be prepared. The substrate 11 may include a semiconductor material. For example, the substrate 11 may include a silicon substrate, a silicon germanium substrate, or a Silicon-On-Insulator (SOI) substrate. The substrate 11 may include a first region R1 and a second region R2. The first region R1 may be referred to as a 'first peripheral region'. The first region R1 may refer to a region in which at least one transistor is to be formed. The second region R2 may be referred to as a 'second peripheral region'. The second region R2 may refer to a region in which at least one through electrode is to be formed.

An isolation layer 13 may be formed in the substrate 11 of the first region R1. For example, the isolation layer 13 may be formed by a Shallow Trench Isolation (STI) process including forming an isolation trench 12 and filling the isolation layer 13 in the isolation trench 12. An active region 14 may be defined by the isolation layer 13. The isolation layer 13 may include, for example, silicon nitride, silicon oxide, or a combination thereof.

Figure 2:
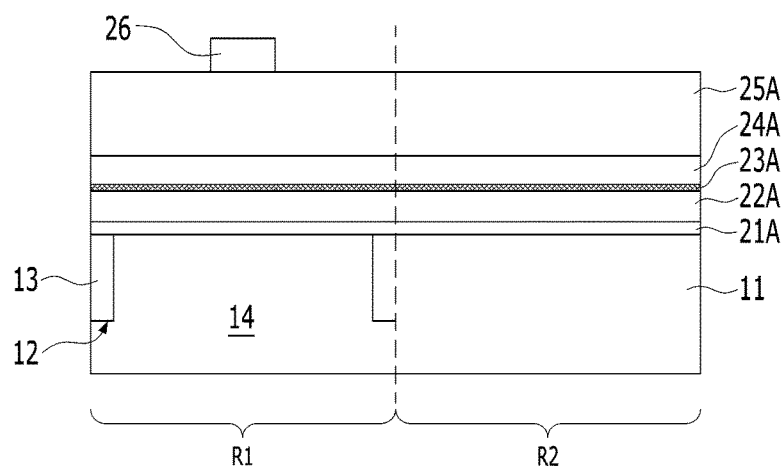

Referring to FIG. 2, a preliminary gate dielectric layer 21A may be formed over the substrate 11. The preliminary gate dielectric layer 21A may include a high-k material, an oxide, a nitride, an oxynitride, or a combination thereof. The high-k material may include hafnium oxide ($HfO_2$), hafnium silicate (HfSiO), hafnium silicate nitride (HfSiON), or a combination thereof. The preliminary gate dielectric layer 21A may further include an interface layer. The interface layer may include silicon oxide, silicon nitride, or a combination thereof. The preliminary gate dielectric layer 21A may be formed in a stacked structure of an interface layer and a high-k material. The interface layer may be formed on the substrate 11 and then the high-k material may be formed on the interface layer.

A preliminary lower gate electrode layer 22A may be formed over the preliminary gate dielectric layer 21A. The preliminary lower gate electrode layer 22A may include a semiconductor material. The preliminary lower gate electrode layer 22A may be doped with an impurity. Impurities may be doped by using a doping process such as, for example, implantation. According to an embodiment of the present invention, the preliminary lower gate electrode layer 22A may include polysilicon. According to another embodiment of the present invention, the preliminary lower gate electrode layer 22A may be formed of a metal-containing material.

A preliminary barrier metal layer 23A may be formed over the preliminary lower gate electrode layer 22A. The height (or thickness) of the preliminary barrier metal layer 23A may be smaller than the height of the preliminary lower gate electrode layer 22A. The preliminary barrier metal layer 23A may include titanium nitride (TiN), tantalum nitride (TaN), tungsten nitride (WN), or a combination thereof. According to an embodiment of the present invention, the preliminary barrier metal layer 23A may include a material containing titanium nitride (TiN).

A preliminary upper gate electrode layer 24A may be formed over the preliminary barrier metal layer 23A. The preliminary upper gate electrode layer 24A may include a material whose specific resistance is lower than that of the preliminary lower gate electrode layer 22A. For example, the preliminary upper gate electrode layer 24A may include a metal, a metal nitride, a metal silicide, or a combination thereof. According to an embodiment of the present invention, the preliminary upper gate electrode layer 24A may include tungsten (W) or a tungsten compound.

A preliminary gate hard mask layer 25A may be formed over the preliminary upper gate electrode layer 24A. The preliminary gate hard mask layer 25A may be formed of a dielectric material having an etch selectivity with respect to the preliminary upper gate electrode layer 24A. The height of the preliminary gate hard mask layer 25A may be greater than the height of the preliminary upper gate electrode layer 24A. The preliminary gate hard mask layer 25A may include silicon oxide, silicon nitride, silicon oxynitride, or a combination thereof. According to an embodiment of the present invention, the preliminary gate hard mask layer 25A may be formed of silicon nitride.

A gate mask 26 may be formed over the preliminary gate hard mask layer 25A of the first region R1. The gate mask 26 may include a photoresist pattern. The gate mask 26 may extend in one direction or in another direction. The gate mask 26 may be formed over only a portion of the first region R1. The second region R2 may not be protected by the gate mask 26. In other words, the preliminary gate hard mask layer 25A of the second region R2 may be completely exposed.

Figure 3:
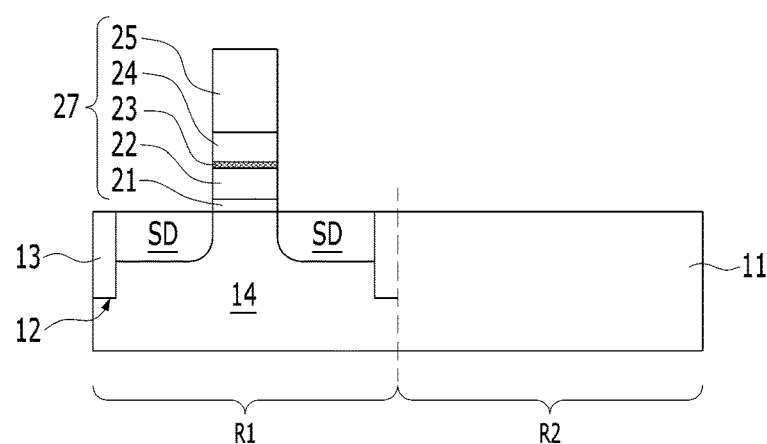

Referring to FIG. 3, a gate structure 27 may be formed over the substrate 11 of the first region R1. The substrate 11 of the second region R2 may be exposed again. The gate structure 27 may be formed over the active region 14 of the first region R1. The gate structure 27 may be at least one selected among a planar gate, a recess gate, a buried gate, an omega gate, and a FIN gate. According to an embodiment of the present invention, the gate structure 27 may be a planar gate.

The gate structure 27 may include a gate dielectric layer 21, a lower gate electrode layer 22, a barrier metal layer 23, an upper gate electrode layer 24, and a gate hard mask layer 25. The gate structure 27 may be formed by etching the preliminary gate hard mask layer 25A, the preliminary upper gate electrode layer 24A, the preliminary barrier metal layer 23A, the preliminary lower gate electrode layer 22A, and the preliminary gate dielectric layer 21A using the gate mask 26. Hence, the gate dielectric layer 21 may be formed by etching the preliminary gate dielectric layer 21A, the lower gate electrode layer 22 may be formed by etching the preliminary lower gate electrode layer 22A, the barrier metal layer 23 may be formed by etching the preliminary barrier metal layer 23A, the upper gate electrode layer 24 may be formed by etching the preliminary upper gate electrode layer 24A, and the gate hard mask layer 25 may be formed by etching the preliminary gate hard mask layer 25A.

After the gate structure 27 is formed, the gate mask 26 may be removed.

Subsequently, the substrate 11 of the first region R1 may be doped with an impurity. As a result, source/drain regions SD may be formed on both sides of the gate structure 27 in the substrate 11. During the etching and doping of the impurities of the first region R1, the second region R2 may be protected by an etch mask (not shown). Therefore, the source/drain regions SD may be formed only in the substrate 11 of the first region R1. The etch mask (not shown) of the second region R2 may be removed after the source/drain regions SD in the first region R1 are formed.

The source/drain regions SD may include an N-type impurity or a P-type impurity. The source/drain region SD may include a low-concentration source/drain region and a high-concentration source/drain region. The high-concentration source/drain region may have a greater junction depth than the low-concentration source/drain region. The high-concentration source/drain region may have a higher doping concentration than the low-concentration source/drain region.

Figure 4:
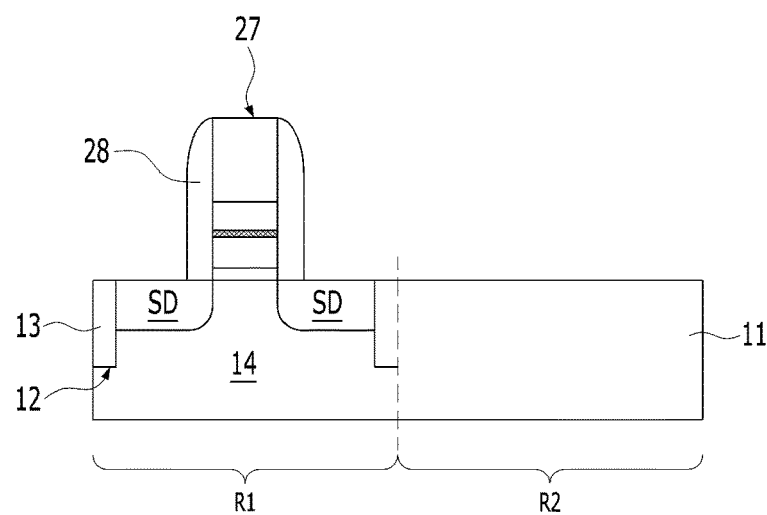

Referring to FIG. 4, gate spacers 28 may be formed to be positioned on both sidewalls of the gate structure 27 of the first region R1. The second region R2 may be protected by an etch mask (not shown). An etch mask (not shown) may be removed after the gate spacers 28 are formed in the first region R1.

The gate spacer 28 may be formed of a dielectric material. For example, the gate spacer 28 may include a low-k material. The gate spacer 28 may include an oxide or a nitride. The gate spacer 28 may include silicon oxide, silicon nitride, or metal oxide. The gate spacer 28 may include $SiO_2$, $Si_3N_4$ or SiN.

The gate spacer 28 may include a multi-layer spacer. The gate spacer 28 may include an air gap. Accordingly, a pair of line-type air gaps may be formed on both sidewalls of the gate spacer 28. The pair of line-type air gaps may be symmetrical. According to some embodiments of the present invention, the multi-layer spacer may include a first spacer, a second spacer, and a third spacer, and the third spacer may be positioned between the first spacer and the second spacer. The multi-layer spacer may include a NON (Nitride-Oxide-Nitride) structure in which an oxide spacer is positioned between nitride spacers. According to another embodiment of the present invention, the multi-layer spacer may include a first spacer, a second spacer, and an air gap between the first spacer and the second spacer.

Figure 5:
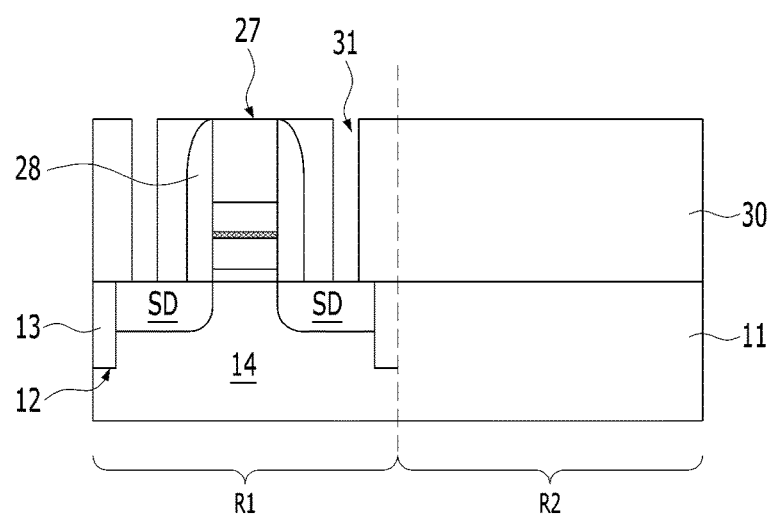

Referring to FIG. 5, a low-level inter-layer dielectric layer 30 may be formed over the exposed surfaces of the substrate 11 of the first region R1 and the second region R2. The low-level inter-layer dielectric layer 30 may fill the gap between adjacent gate structures 27.

The low-level inter-layer dielectric layer 30 may be planarized to expose an upper surface of the gate structure 27. Accordingly, the height of the gate structure 27 of the first region R1 and the height of the low-level inter-layer dielectric layer 30 of the second region R2 may be the same. During the planarization process of the low-level inter-layer dielectric layer 30, the gate spacer 28 may be planarized in such a manner that the upper surface of the gate structure 27 is exposed. The low-level inter-layer dielectric layer 30 may extend parallel to the gate structure 27.

The low-level inter-layer dielectric layer 30 may be formed of a material having an etch selectivity with respect to the gate spacer 28. The low-level inter-layer dielectric layer 30 may include a dielectric material. For example, the low-level inter-layer dielectric layer 30 may include silicon oxide or silicon nitride. The low-level inter-layer dielectric layer 30 may include a Spin-On Dielectric material (SOD).

Subsequently, a metal interconnection contact hole 31 may be formed in the low-level inter-layer dielectric layer 30 of the first region R1. A metal interconnection contact mask (not shown) may be formed to form the metal interconnection contact hole 31. The low-level inter-layer dielectric layer 30 may be etched by using the metal interconnection contact mask as an etch mask. Accordingly, a portion of the substrate 11 may be exposed. The surface of the source/drain region SD may be exposed by the metal interconnection contact hole 31. The metal interconnection contact hole 31 may be formed to be spaced apart from the gate structure 27. A pair of metal interconnection contact holes 31 may be formed, each one on either side of the gate structure 27.

Figure 6:
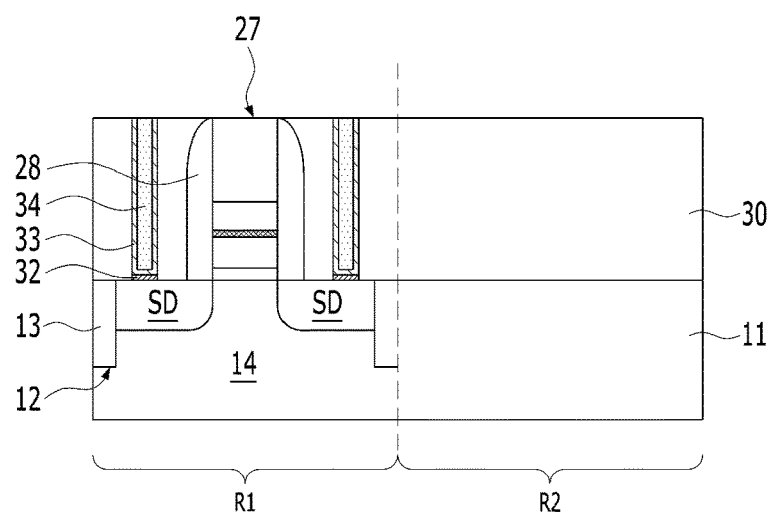

Referring to FIG. 6, the metal interconnection contact hole 31 may be filled with an ohmic contact layer 32, a conductive liner 33, and a low-level contact plug 34. In this case, the second region R2 may be protected by an etch mask (not shown). The etch mask (not shown) may be removed after the ohmic contact layer 32, the conductive liner 33, and the low-level contact plug 34 are formed in the first region R1.

First, an ohmic contact layer 32 may be formed in the metal interconnection contact hole 31. The ohmic contact layer 32 may be formed over the source/drain region SD exposed by the metal interconnection contact hole 31. In order to form the ohmic contact layer 32, a process of depositing a silicidable metal layer followed by an annealing process may be performed. The ohmic contact layer 32 may include metal silicide. For example, the ohmic contact layer 32 may include cobalt silicide ($CoSi_x$). The ohmic contact layer 32 may include '$CoSi_2$ phase' cobalt silicide. Therefore, it is possible to improve the contact resistance.

Subsequently, a conductive liner 33 may be selectively formed over the ohmic contact layer 32. The conductive liner 33 may also cover a sidewall of the metal interconnection contact hole 31. The conductive liner 33 may cover the low-level inter-layer dielectric layer exposed by the metal interconnection contact hole 31. For example, the conductive liner 33 may include a metal or a metal nitride. The conductive liner 33 may include titanium (Ti), titanium nitride (TiN), titanium silicon nitride (TiSiN), tantalum (Ta), tantalum nitride (TaN), tungsten nitride (WN), or a combination thereof.

A low-level contact plug 34 may be formed over the conductive liner 33. The low-level contact plug 34 may fill the metal interconnection contact hole 31. A planarization process may be performed to form the low-level contact plugs 34. Accordingly, the upper surface of the low-level contact plug 34 may be positioned at the same level as the upper surface of the low-level inter-layer dielectric layer 30. The low-level contact plug 34 may include a metal or a metal compound. For example, the low-level contact plug 34 may include a tungsten (W)-containing material. The low-level contact plug 34 may include tungsten or a tungsten compound.

The low-level contact plug 34 may be formed by a Chemical Vapor Deposition (CVD) process, a Physical Vapor Deposition (PVD) process, or an Atomic Layer Deposition (ALD) process. The low-level contact plug 34 may use plasma to increase the deposition effect. For example, the low-level contact plug 34 may be formed by such a method as Plasma Enhanced Chemical Vapor Deposition (PECVD) or Plasma Enhanced Atomic Layer Deposition (PEALD).

Figure 7:
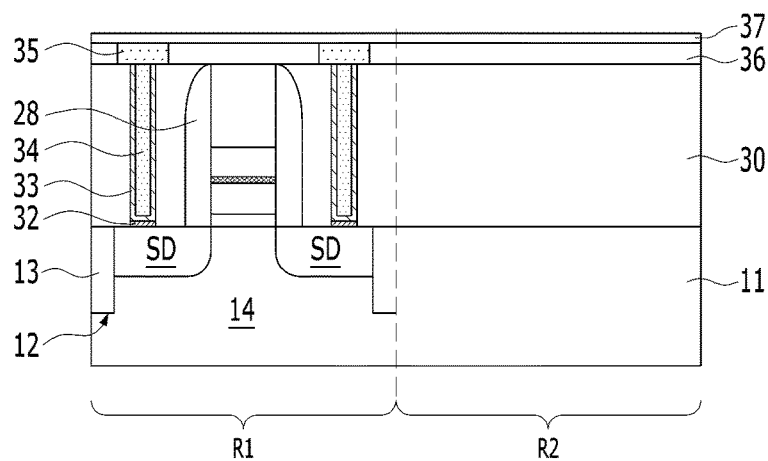

Referring to FIG. 7, a low-level metal interconnection 35 may be formed over the low-level contact plug 34. The low-level contact plug 34 and the low-level metal interconnection 35 may be referred to as a 'lower metal interconnection structure'. Although this embodiment shows one 'lower metal interconnection structure' disposed over one source/drain region SD, two or more lower metal interconnection structures may be stacked according to another embodiment of the present invention. In other words, one or more 'lower metal interconnection structures' may be formed and stacked on each other. While the low-level metal interconnection 35 is formed, the second region R2 may be protected by an etch mask (not shown). The etch mask (not shown) may be removed after the low-level metal interconnection 35 is formed in the first region R1.

The low-level metal interconnection 35 may extend in a line shape from a top planar view. The low-level metal interconnection may be electrically connected to the low-level contact plug 34. The low-level metal interconnection 35 may be electrically connected to the source/drain region SD through the low-level contact plug 34. The width of the low-level metal interconnection 35 may be greater than the width of the low-level contact plug 34. The height of the low-level metal interconnection 35 may be smaller than the height of the low-level contact plug 34.

The low-level metal interconnection 35 may be formed by a Chemical Vapor Deposition (CVD) process, a Physical Vapor Deposition (PVD) process, an Atomic Layer Deposition (ALD) process, a PECVD process, or a PEALD process. A method for forming the low-level contact plug 34 and a method for forming the low-level metal interconnection 35 may be different. For example, the low-level contact plug 34 may be formed by a chemical vapor deposition (CVD) process, and the low-level metal interconnection 35 may be formed by a physical vapor deposition (PVD) process. According to another embodiment of the present invention, the low-level contact plug 34 and the low-level metal interconnection 35 may be integrally formed through a single deposition process.

The low-level metal interconnection 35 may include a metal or a metal compound. The low-level metal interconnection 35 may include, for example, gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), molybdenum (Mo), or a combination thereof. The low-level metal interconnection 35 may be a single layer or a multi-layer. According to an embodiment of the present invention, the low-level metal interconnection 35 may include a tungsten (W)-containing material.

Subsequently, a lower capping layer 36 may be formed over the low-level inter-layer dielectric layer 30 and the low-level metal interconnection 35. The lower capping layer 36 may fill the space between the low-level metal interconnections 35. The lower capping layer 36 may cover a sidewall portion of the low-level metal interconnection 35. The height of the lower capping layer 36 may be the same as the height of the low-level metal interconnection 35. A planarization process may be performed to form the lower capping layer 36. Accordingly, the upper surface of the low-level metal interconnection 35 may be exposed. The lower capping layer 36 may protect the low-level metal interconnection 35 from the subsequent processes.

The lower capping layer 36 may include a dielectric material. For example, the lower capping layer 36 may include silicon nitride. The lower capping layer 36 may include a poor step-coverage material. The lower capping layer 36 may be formed, for example, by a Plasma Enhanced Chemical Vapor deposition (PECVD) process.

An etch stop layer 37 may be formed over the lower capping layer 36 and the low-level metal interconnection 35. The thickness of the etch stop layer 37 may be thinner than the thickness of the low-level metal interconnection 35. The etch stop layer 37 may include a nitrogen-containing material.

Figure 8:
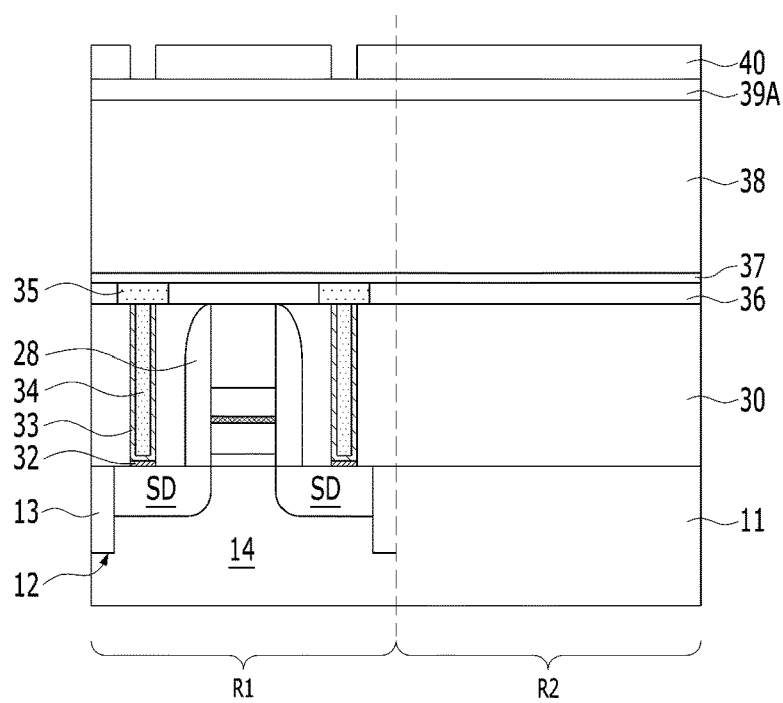

Referring to FIG. 8, an inter-layer dielectric layer 38 may be formed over the etch stop layer 37.

The height of the inter-layer dielectric layer 38 may be greater than the height of the low-level inter-layer dielectric layer 30. The inter-layer dielectric layer 38 may include a single layer or a stacked structure of a plurality of layers. The inter-layer dielectric layer 38 may include a dielectric material. The inter-layer dielectric layer 38 may include an oxide or a nitride. The inter-layer dielectric layer 38 may include silicon oxide, silicon nitride, silicon oxynitride, or a combination thereof. The inter-layer dielectric layer 38 may include TEOS.

A preliminary contact hole hard mask layer 39A may be formed over the inter-layer dielectric layer 38. The preliminary contact hole hard mask layer 39A may include a material having an etch selectivity with respect to the inter-layer dielectric layer 38. The preliminary contact hole hard mask layer 39A may include a dielectric material. The preliminary contact hole hard mask layer 39A may include, for example, silicon oxide, silicon nitride, silicon oxynitride, or a combination thereof. According to an embodiment of the present invention, the preliminary contact hole hard mask layer 39A may include silicon nitride.

A contact hole mask pattern 40 may be formed over the preliminary contact hole hard mask layer 39A. The contact hole mask pattern 40 may include a photoresist pattern. The contact hole mask pattern 40 may cover the preliminary contact hole hard mask layer 39A of the second region R2.

Figure 9:
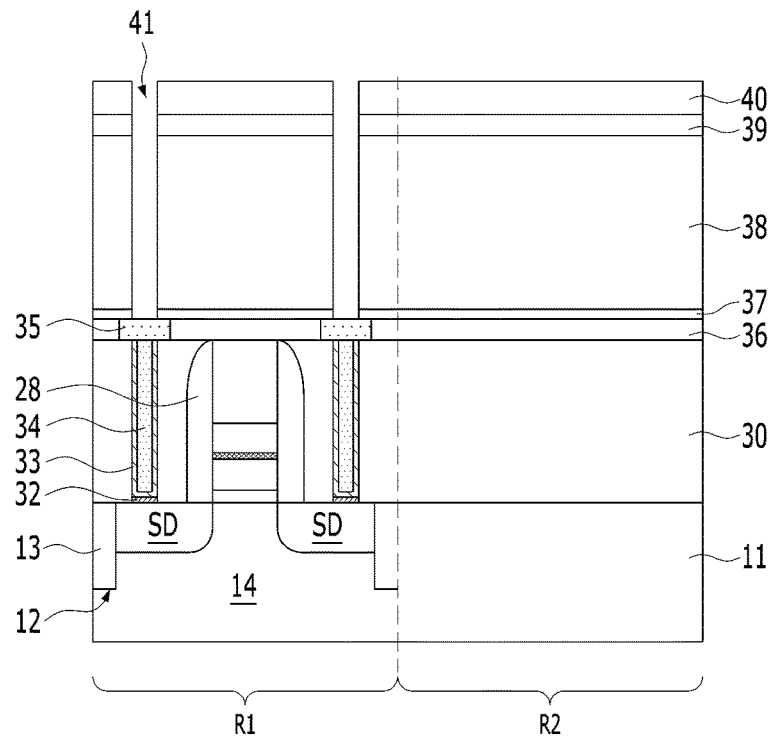

Referring to FIG. 9, a contact hole 41 may be formed in the inter-layer dielectric layer 38 of the first region R1.

The preliminary contact hole hard mask layer 39A may be etched by using the contact hole mask pattern 40 as an etch mask. Accordingly, the contact hole hard mask 39 may be formed. The inter-layer dielectric layer 38 may be etched by using the contact hole hard mask 39 as an etch mask. Accordingly, the contact hole 41 may be formed.

The contact hole 41 may penetrate the contact hole hard mask 39 and the inter-layer dielectric layer 38. The upper surface of the low-level metal interconnection 35 may be partially exposed by the contact hole 41.

After the contact hole 41 is formed, the contact hole mask pattern 40 may be removed.

Figure 10:
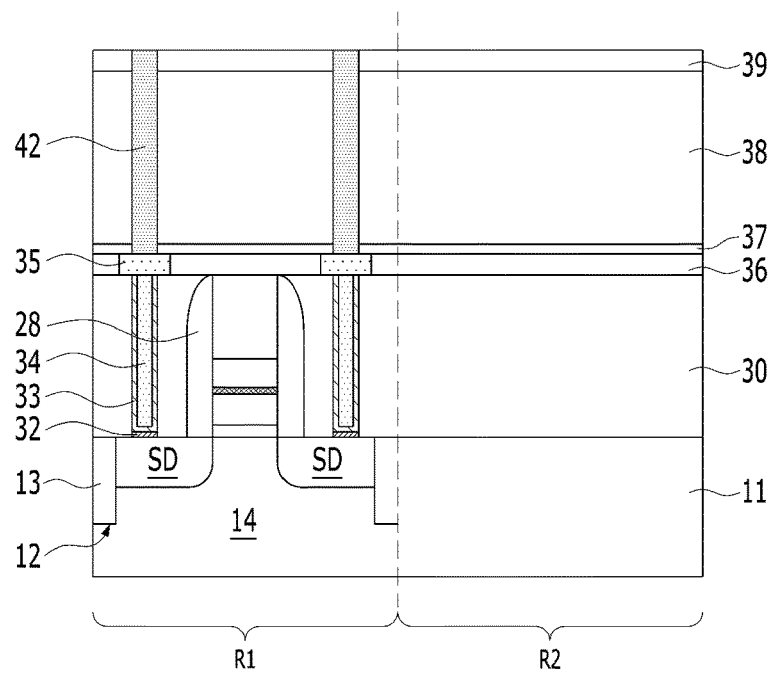

Referring to FIG. 10, a contact plug 42 filling the contact hole 41 may be formed.

A contact plug 42 may be formed over the low-level metal interconnection 35. The contact plug 42 may penetrate the contact hole hard mask 39 and the inter-layer dielectric layer 38. A planarization process may be performed to form the contact plug 42. Accordingly, the upper surface of the contact plug 42 may be positioned at the same level as the upper surface of the contact hole hard mask 39. The contact plug 42 may include a metal or a metal compound. For example, the contact plug 42 may include a tungsten-containing material. The contact plug 42 may include tungsten or a tungsten compound.

The contact plug 42 may be formed by a Chemical Vapor Deposition (CVD) process, a Physical Vapor Deposition (PVD) process, or an Atomic Layer Deposition (ALD) process. The contact plug 42 may use plasma to increase the deposition effect. In other words, the low-level contact plug 34 may be formed by a method such as Plasma Enhanced Chemical Vapor Deposition (PECVD) or Plasma Enhanced Atomic Layer Deposition (PEALD).

According to another embodiment of the present invention, the contact plug 42 may have the same structure as the low-level contact plug 34. In other words, the contact hole 41 may be filled with an ohmic contact layer (not shown), a conductive liner (not shown), and a contact plug 42.

First, an ohmic contact layer (not shown) may be formed in the contact hole 41. The ohmic contact layer (not shown) may be formed over the low-level metal interconnection 35 which is exposed by the contact hole 41. In order to form the ohmic contact layer (not shown), a process of depositing a silicidable metal layer followed by an annealing process may be performed. The ohmic contact layer (not shown) may include cobalt silicide ($CoSi_x$).

Subsequently, a conductive liner (not shown) may be selectively formed over the ohmic contact layer (not shown). A conductive liner (not shown) may cover a sidewall and a bottom surface of the contact hole 41. The conductive liner (not shown) may include titanium (Ti), titanium nitride (TiN), titanium silicon nitride (TiSiN), tantalum (Ta), tantalum nitride (TaN), tungsten nitride (WN), or a combination thereof.

A contact plug 42 may be formed over a conductive liner (not shown). The contact plug 42 may fill the contact hole 41. A planarization process may be performed to form the contact plug 42.

Figure 11:
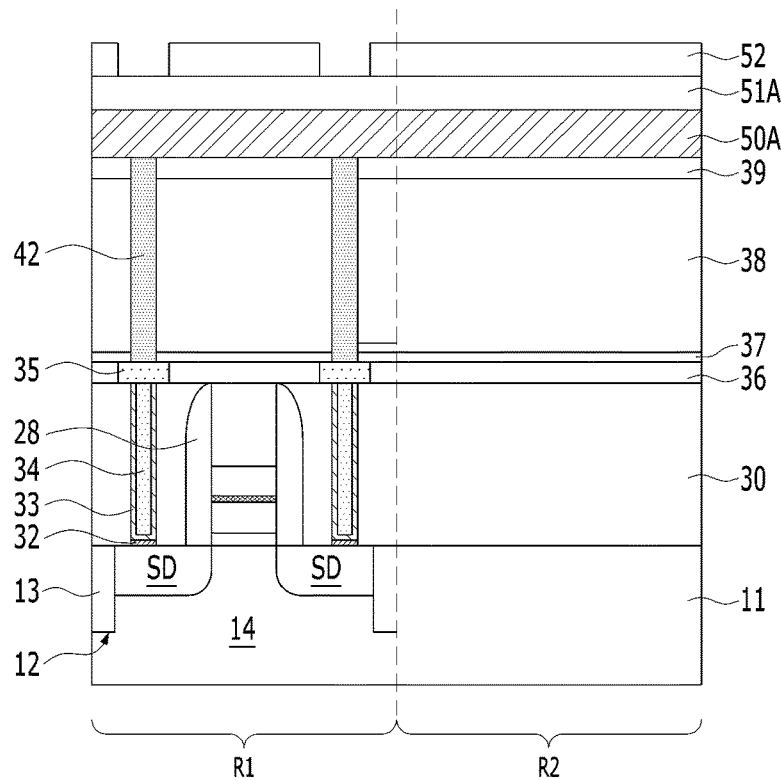

Referring to FIG. 11, a preliminary capping layer 50A may be formed over the contact hole hard mask 39 and the contact plug 42.

The preliminary capping layer 50A may cover the contact hole hard mask 39 and the contact plug 42. The thickness of the preliminary capping layer 50A may be thicker than the thickness of the contact hole hard mask 39. The preliminary capping layer 50A may include an oxygen-containing material. The preliminary capping layer 50A may include an oxide. The preliminary capping layer 50A may include silicon oxide. The preliminary capping layer 50A may include only an oxide. The preliminary capping layer 50A may not contain a nitride. The preliminary capping layer 50A may be nitride-free.

A preliminary metal interconnection hard mask layer 51A may be formed over the preliminary capping layer 50A. The preliminary metal interconnection hard mask layer 51A may include a material having an etch selectivity with respect to the preliminary capping layer 50A. The preliminary metal interconnection hard mask layer 51A may include a dielectric material. The preliminary metal interconnection hard mask layer 51A may include, for example, silicon nitride, silicon oxynitride, a carbon-containing material, or a combination thereof.

A metal interconnection mask 52 may be formed over the preliminary metal interconnection hard mask layer 51A. The metal interconnection mask 52 may include a photoresist pattern.

Figure 12:
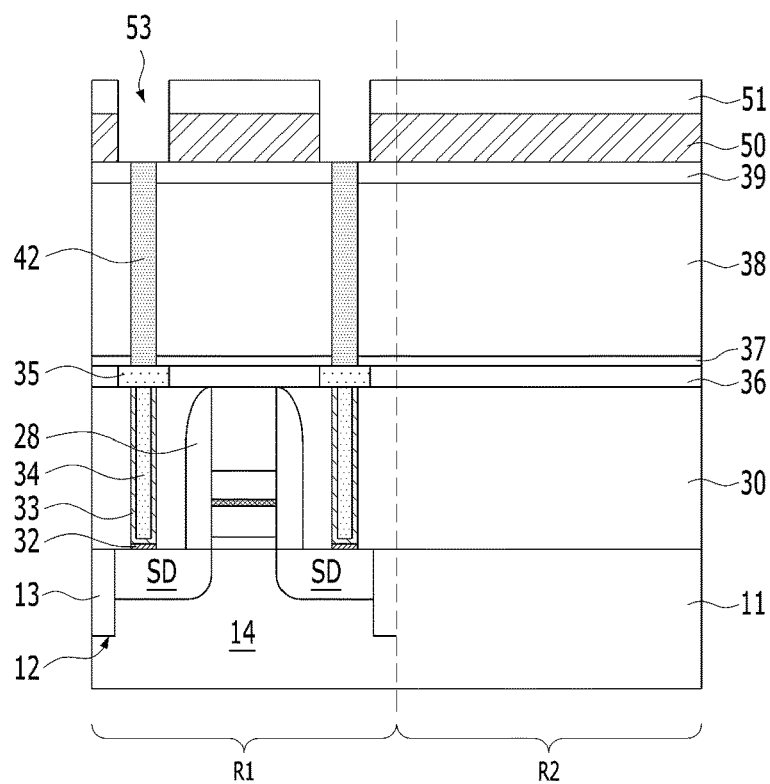

Referring to FIG. 12, the preliminary metal interconnection hard mask layer 51A may be etched by using the metal interconnection mask 52 as an etch mask. Accordingly, the metal interconnection hard mask layer 51 may be formed. The preliminary capping layer 50A may be etched by using the metal interconnection hard mask layer 51 as an etch mask. Accordingly, a capping layer 50 and a trench 53 may be formed.

The trench 53 may penetrate the metal interconnection hard mask layer 51 and the capping layer 50 to expose partially the contact hole hard mask 39. The upper surface of the contact plug 42 may be exposed through the trench 53. Viewed from the top, the trench 53 may extend in a line shape in a direction perpendicular to the direction of stacking.

After the capping layer 50 and the trench 53 are formed, the metal interconnection mask 52 and the metal interconnection hard mask layer 51 may be removed.

Figure 13:
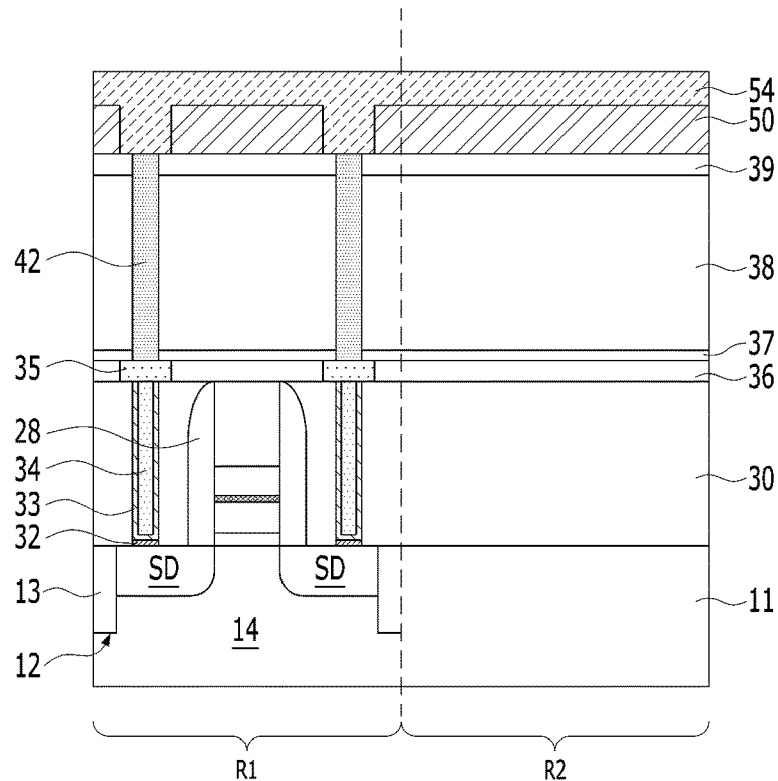

Referring to FIG. 13, a sacrificial layer 54 may be formed over the capping layer 50 and fill the trenches 53.

The sacrificial layer 54 may cover the upper surface of the capping layer 50 while filling the trench 53. The height from the upper surface of the contact hole hard mask 39 to the upper surface of the sacrificial layer 54 may be greater than the height from the upper surface of the contact hole hard mask 39 to the upper surface of the capping layer 50. The height from the upper surface of the capping layer 50 to the upper surface of the sacrificial layer 54 may be smaller than the height from the upper surface of the contact hole hard mask 39 to the upper surface of the capping layer 50.

The sacrificial layer 54 may include, for example, an oxide or polysilicon. The sacrificial layer 54 may include a Spin-On-Dielectric (SOD). The sacrificial layer 54 may include carbon. The sacrificial layer 54 may include one selected among Spin-On-Carbon (SOC), high density plasma (HDP), and borophosphosilicate glass (BPSG). In an embodiment, the sacrificial layer 54 may include hard mask carbon. The hard mask carbon may include a carbon layer deposited through a Chemical Vapor Deposition (CVD) process. According to an embodiment of the present invention, the sacrificial layer 54 may include Spin-On-Carbon (SOC).

Figure 14:
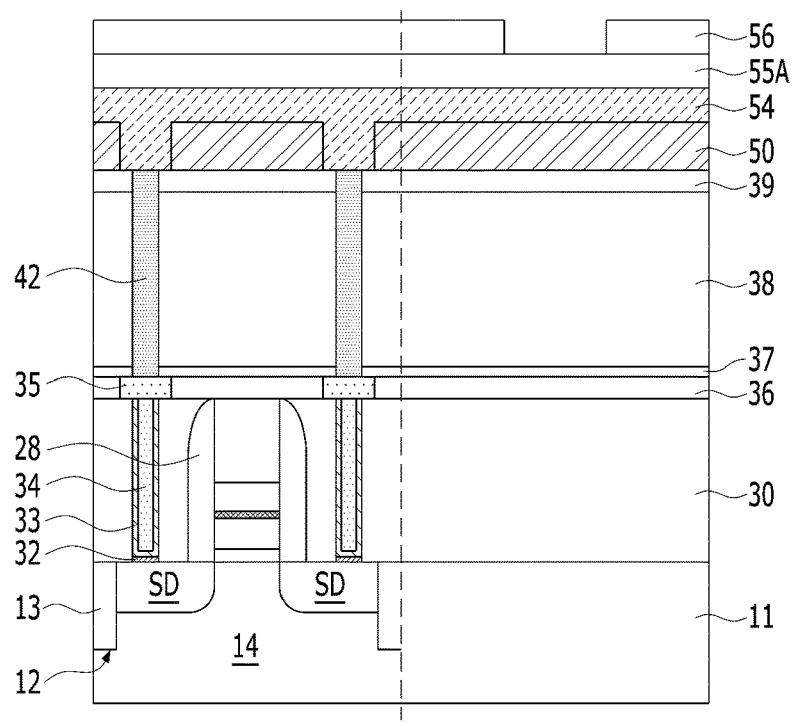

Referring to FIG. 14, a preliminary through-hole hard mask layer 55A may be formed over the sacrificial layer 54.

The preliminary through-hole hard mask layer 55A may cover the first region R1. The preliminary through-hole hard mask layer 55A may include a material having an etch selectivity with respect to the sacrificial layer 54. The preliminary through-hole hard mask layer 55A may include a dielectric material. For example, the preliminary through-hole hard mask layer 55A may include silicon nitride, silicon oxynitride, a carbon-containing material, or a combination thereof.

A through-hole mask pattern 56 may be formed over the preliminary through-hole hard mask layer 55A. The through-hole mask pattern 56 may include a photoresist pattern.

Figure 15:
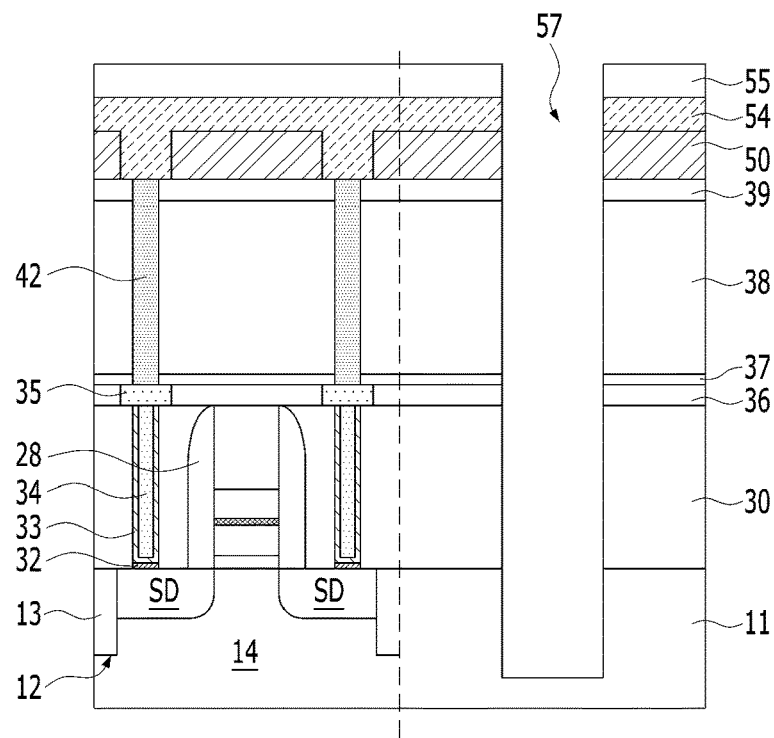

Referring to FIG. 15, the preliminary through-hole hard mask layer 55A may be etched by using the through-hole mask pattern 56 as an etch mask. As a result, a through-hole hard mask 55 may be formed. Using the through-hole hard mask 55 as an etch mask, the sacrificial layer 54, the capping layer 50, the contact hole hard mask 39, the inter-layer dielectric layer 38, the etch stop layer 37, the lower capping layer 36, and the low-level inter-layer dielectric layer 30 may be etched. As a result, a through hole 57 may be formed.

The through hole 57 may be formed to be spaced apart from the contact plug 42. The through hole 57 may be formed to be spaced apart from the trench 53. The width of the through hole 57 may be greater than the width of the contact plug 42. The width of the through hole 57 may be greater than the width of the trench 53, but is not limited thereto. The through hole 57 may penetrate the sacrificial layer 54, the capping layer 50, the contact hole hard mask 39, the inter-layer dielectric layer 38, the etch stop layer 37, the lower capping layer 36, and the low-level inter-layer dielectric layer and may extend into the substrate 11. The depth of the through hole 57 in the substrate 11 may be greater than the depth of the isolation layer 13. According to another embodiment of the present invention, the through hole 57 may penetrate the substrate 11. In an embodiment, the sidewall of the through hole 57 may have a slope. The sidewall of the through hole 57 may have a sloped-profile. The width of the through hole 57 may decrease as it goes from a high level to a low level.

After the through-hole 57 is formed, the through-hole hard mask 55 may be removed.

Figure 16:
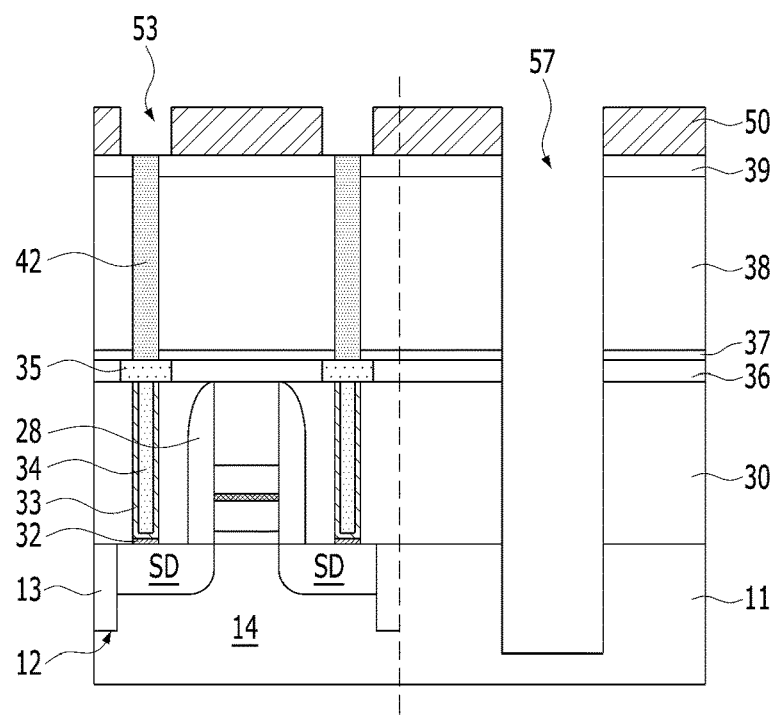

Referring to FIG. 16, the sacrificial layer 54 may be removed.

As the sacrificial layer 54 is removed, the capping layer 50 and the trench 53 may be exposed again. Accordingly, the upper surface of the contact plug 42 may be exposed. The sacrificial layer 54 may be removed by diverse suitable methods, such as a dip-out process, an ashing process, etc. For example, when the sacrificial layer 54 is formed of SOD, it may be removed through a dip-out process, and when it is formed of SOC, it may be removed through an ashing process. When a wet dip-out process is performed to remove the sacrificial layer 54, a wet chemical such as hydrofluoric acid or Buffered Oxide Etchant (BOE) may be used.

Figure 17:
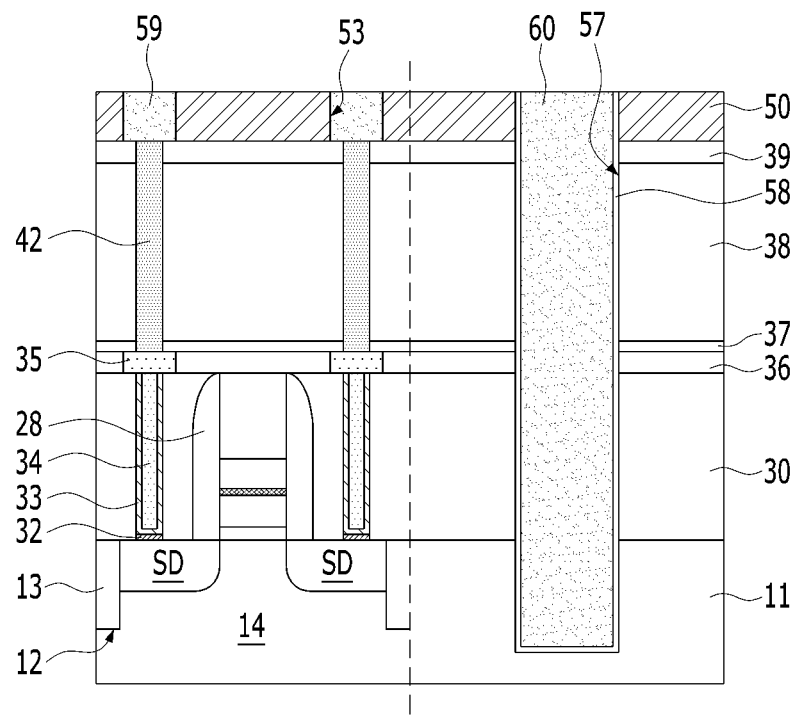

Referring to FIG. 17, a dielectric liner 58 surrounding the sidewall and the bottom surface of the through hole 57 may be formed. According to another embodiment of the present invention, the dielectric liner 58 may have a shape surrounding only the sidewall of the through hole 57 and may not cover the bottom surface of the through hole 57. The dielectric liner 58 may include a dielectric material. The dielectric liner 58 may include, for example, an oxide, a nitride, or a combination thereof. The dielectric liner 58 may include silicon oxide, silicon nitride, silicon oxynitride, or a combination thereof. According to an embodiment of the present invention, the dielectric liner 58 may include an oxide. According to another embodiment of the present invention, the dielectric liner 58 may be formed in the trench 53 as well.

Although not illustrated, a barrier layer may be formed over the dielectric liner 58. The barrier layer may be a single layer or a laminate of two or more. The barrier layer may include a metal-containing material. The barrier layer may include a metal or a metal compound. The barrier layer may include a material, such as Ta, TaN, Ti, TiN, Ru, Co, Ni, NiB, or WN.

Subsequently, a metal material filling the through hole 57 may be formed over the dielectric liner 58. A metal material filling the trench 53 may be formed over the contact plug 42. The metal material may cover the capping layer 50. A process of planarizing the metal material may be performed to expose the upper surface of the capping layer 50. As a result, a through electrode 60 may be formed over the dielectric liner 58. A metal interconnection 59 may be formed over the contact plug 42. The through electrode 60 and the metal interconnection 59 may be simultaneously formed. The through electrode 60 and the metal interconnection 59 may be formed separately. The upper surface of the through electrode 60 and the upper surface of the metal interconnection 59 may be positioned at the same level. A sidewall of the metal interconnection 59 may directly contact the capping layer 50.

The through electrode 60 and the metal interconnection 59 may include one or more stacked structures. The metal material filling the through electrode 60 and the metal interconnection 59 may include a metal having high conductivity. The metal material filling the through electrode 60 and the metal interconnection 59 may include the same material. The metal material may include one or more selected among Al, Au, Be, Bi, Co, Cu, Hf, In, Mn, Mo, Ni, Pb, Pd, Pt, Rh, Re, Ru, Ta, Te, Ti, W, Zn, and Zr. For example, the through electrode 60 and the metal interconnection 59 may include copper (Cu) or tungsten (W). According to an embodiment of the present invention, the through electrode 60 and the metal interconnection 59 may include copper (Cu). The metal material may be formed by any suitable method such as, for example, chemical vapor deposition (CVD), physical vapor deposition (PVD), atomic layer deposition (ALD), PECVD, PEALD, or the like.

The method for fabricating a semiconductor device in accordance with an embodiment of the present invention may be able to improve RC delay and reduce process defects, such as ion migration, as the capping layer 50 is positioned between the metal interconnections 59. Accordingly, the characteristics of the semiconductor device may be improved.

Also, when the metal interconnection 59 and the through electrode 60 are simultaneously formed, process stability may be secured and the process may be simplified, which leads to improvement of the yield.

Figure 18:
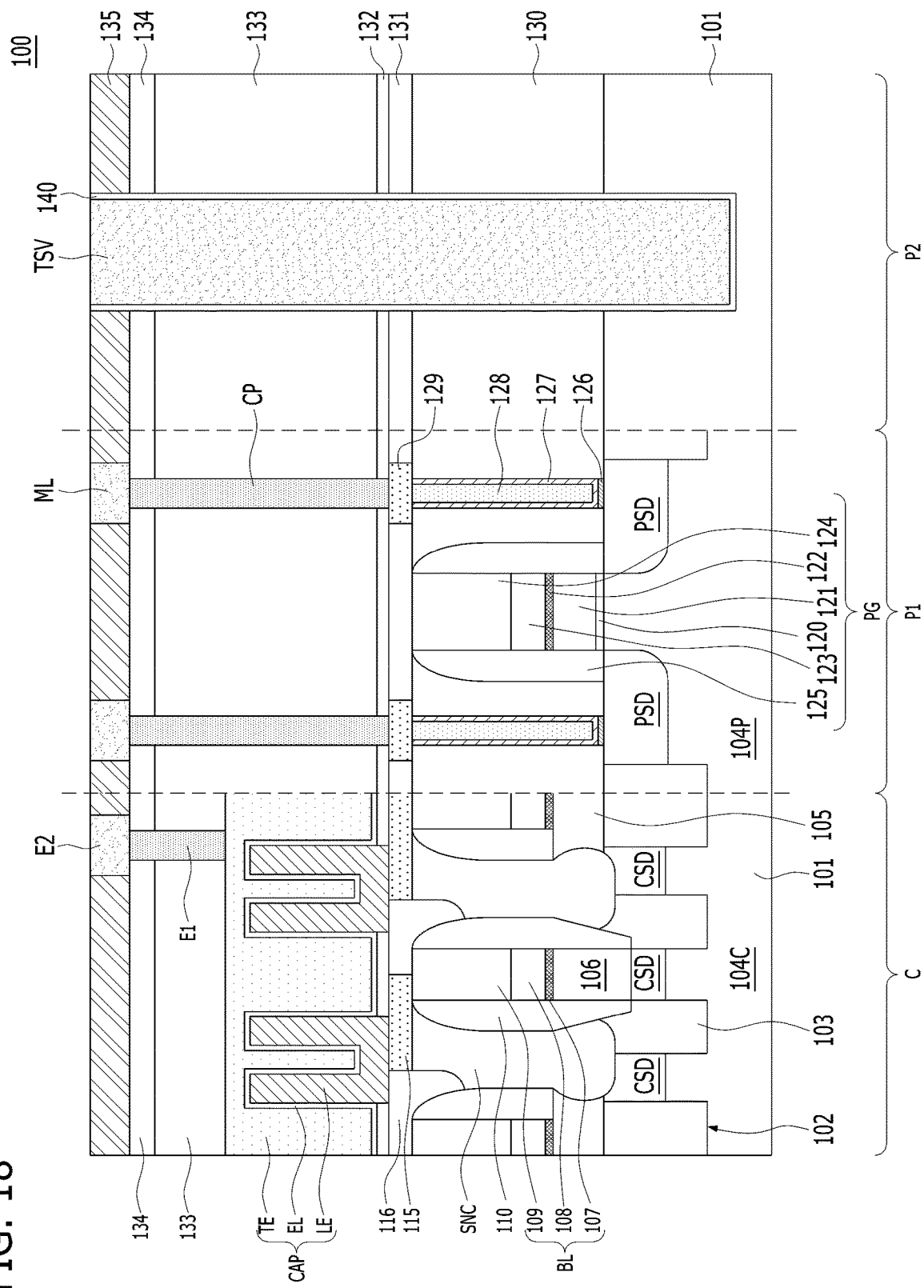
FIG. 18 is a cross-sectional view illustrating a semiconductor device in accordance with an embodiment of the present invention.

FIG. 18 is a cross-sectional view illustrating the semiconductor device 100 in accordance with an embodiment of the present invention.

Referring to FIG. 18, the semiconductor device 100 may include a substrate 101. The substrate 101 may include a cell region C, a first peripheral region P1, and a second peripheral region P2. The cell region C may include a capacitor CAP. The first peripheral region P1 may include a metal interconnection ML. The second peripheral region P2 may include a through electrode TSV.

The substrate 101 may include, for example, a silicon-containing material. The substrate 101 may include silicon, monocrystalline crystal silicon, polysilicon, amorphous silicon, a combination thereof, or a multi-layer thereof. In another example, the substrate 101 may include another semiconductor material such as germanium. In yet another example, the substrate 101 may include a III-V-group semiconductor substrate, for example, a compound semiconductor substrate such as GaAs. The substrate 101 may include a Silicon-On-Insulator (SOI) substrate.

An isolation layer 103 may be formed in the substrate 101 of the cell region C and the first peripheral region P1. The isolation layer 103 may be formed by a Shallow Trench Isolation (STI) process. The isolation layer 103 may be formed in the trench 102. The trench 102 may be formed in the substrate 101 of the cell region C and the first peripheral region P1. The isolation layer 103 may define a plurality of cell active regions 104C in the cell region C. The isolation layer 103 may define a peripheral active region 104P in the first peripheral region P1. The cell active regions 104C and the peripheral active region 104P may have a shape isolated by the isolation layer 103.

First, the cell region C will be described.

The cell region C may include a cell source/drain region CSD. The cell source/drain region CSD may be doped with an N-type impurity or a P-type impurity.

A bit line contact plug 106 may be formed over the substrate 101. The bit line contact plug 106 may be coupled to the cell source/drain region CSD. The bit line contact plug 106 may be formed through the cell inter-layer dielectric layer 105. The cell inter-layer dielectric layer 105 may be formed over the substrate 101. The cell inter-layer dielectric layer 105 may include a dielectric material. The lower surface of the bit line contact plug 106 may be positioned at a lower level than the upper surface of the substrate 101. The bit line contact plug 106 may be formed of polysilicon or a metal material.

A bit line structure BL may be formed over the bit line contact plug 106. The bit line structure BL may include a stack of a cell barrier layer 107, a bit line 108, and a bit line hard mask 109.

A cell barrier layer 107 may be formed over the bit line contact plug 106. The cell barrier layer 107 may include titanium (Ti), titanium nitride (TiN), titanium silicon nitride (TiSiN), tantalum (Ta), tantalum nitride (TaN), tungsten nitride (WN), or a combination thereof.

The line width of the bit line 108 and the line width of the bit line contact plug 106 may be the same. The bit line 108 may extend in one direction while covering the cell barrier layer 107. The bit line 108 may include a metal, a metal nitride, a metal silicide, or a combination thereof. According to an embodiment of the present invention, the bit line 108 may include tungsten (W) or a tungsten compound.

A bit line hard mask 109 may be formed over the bit line 108. The thickness of the bit line hard mask 109 may be greater than the thickness of the bit line 108. The bit line hard mask 109 may include a dielectric material. In an embodiment, the bit line hard mask 109 may include silicon nitride.

Bit line spacers 110 may be formed on both sidewalls of the bit line structure BL. The bit line spacers 110 may be formed of a dielectric material. The bit line spacers 110 may include multi-layer spacers. The multi-layer spacers may include a first spacer, a second spacer, and a third spacer, and the third spacer may be positioned between the first spacer and the second spacer. The multi-layer spacers may include a NON structure in which an oxide spacer is positioned between nitride spacers. According to another embodiment of the present invention, the multi-layer spacers may include a first spacer, a second spacer, and an air gap between the first spacer and the second spacer.

A storage node contact plug SNC may be formed on both sidewalls of the bit line contact plug 106 and the bit line structure BL. The storage node contact plug SNC may be independently formed on both sides of the bit line structure BL. The storage node contact plug SNC may be positioned between the substrate 101 and the capacitor CAP. The storage node contact plug SNC may include a lower plug (not shown), a cell ohmic contact layer (not shown), and an upper plug (not shown).

A lower plug (not shown) penetrating the cell inter-layer dielectric layer 105 may be formed. The lower plug (not shown) may include a bulb type. The lower plug (not shown) may include a silicon-containing material. The lower plug (not shown) may include polysilicon. A cell ohmic contact layer (not shown) may be formed over the lower plug (not shown). The cell ohmic contact layer (not shown) may include a metal silicide. An upper plug (not shown) may be formed over the cell ohmic contact layer (not shown). The upper plug (not shown) may include a metal-containing material. The upper plug (not shown) may include tungsten (W).

A landing pad 115 may be formed over the storage node contact plug SNC. The landing pad 115 may be electrically connected to the storage node contact plug SNC. The landing pad 115 may partially overlap with the bit line structure BL.

A cell capping layer 116 covering the bit line structure BL may be formed. The cell capping layer 116 may partially cover the upper surface of the bit line structure BL. The cell capping layer 116 may partially cover the upper surface of the bit line spacer 110. The cell capping layer 116 may cover a sidewall of the landing pad 115. The upper surface of the cell capping layer 116 may be positioned at the same level as the upper surface of the landing pad 115. The cell capping layer 116 may include a dielectric material. The cell capping layer 116 may include silicon nitride. An etch stop layer 132 may be formed over the landing pad 115 and the cell capping layer 116.

A capacitor CAP may be formed over the landing pad 115. The capacitor CAP may be electrically connected to the storage node contact plug SNC. The capacitor CAP may be capped by an inter-layer dielectric layer 133.

The capacitor CAP may include a lower electrode LE, a dielectric layer EL, and an upper electrode TE. The lower electrode LE may have a cylinder shape or a pillar shape. According to an embodiment of the present invention, the lower electrode LE may have a cylindrical shape. The lower electrode LE may include a metal or a metal compound. The dielectric layer EL may have a shape surrounding the lower electrode LE. The dielectric layer EL may include a high-k material. The dielectric layer EL may be formed by depositing a high-k material, such as zirconium oxide ($ZrO_2$). The dielectric layer EL may be formed of a composite layer. For example, the dielectric layer EL may be formed of a composite layer of ZAZ ($ZrO_2/Al_2O_3/ZrO_2$). An upper electrode TE may be formed over the dielectric layer EL. The upper electrode TE may cover the dielectric layer EL. The upper electrode TE may include a metal or a metal compound. For example, the upper electrode TE may be formed by depositing titanium nitride (TiN) and tungsten (W).

An inter-layer dielectric layer 133 may be formed over the upper electrode TE. The inter-layer dielectric layer 133 may include a single layer or a stacked structure of a plurality of layers. The inter-layer dielectric layer 133 may include an oxide, a nitride, or a combination thereof. In an embodiment, the inter-layer dielectric layer 133 may include TEOS.

A contact hole hard mask 134 may be formed over the inter-layer dielectric layer 133. The contact hole hard mask 134 may include a material having an etch selectivity with respect to the inter-layer dielectric layer 133. The contact hole hard mask 134 may include a dielectric material.

A first interconnection E1 penetrating the contact hole hard mask 134 and the inter-layer dielectric layer 133 may be formed. The first interconnection E1 may directly contact the upper electrode TE. Accordingly, the first interconnection E1 may be electrically connected to the capacitor CAP. The first interconnection E1 may be formed simultaneously with a contact plug CP, which will be described later. The first interconnection E1 may be formed separately from a contact plug CP, which will be described later. The first interconnection E1 may have the same structure as that of the contact plug CP. The first interconnection E1 may include the same material as that of the contact plug CP.

A capping layer 135 may be formed over the contact hole hard mask 134. The capping layer 135 may be formed to be thicker than the contact hole hard mask 134. The capping layer 135 may cover the contact hole hard mask 134. The thickness of the capping layer 135 may be greater than the thickness of the contact hole hard mask 134.

The capping layer 135 may include an oxygen-containing material. The capping layer 135 may include an oxide. The capping layer 135 may include silicon oxide. The capping layer 135 may include only an oxide. The capping layer 135 may be formed of an oxide. The capping layer 135 may not contain a nitride. The capping layer 135 may be nitride-free.

A second interconnection E2 may be formed over the first interconnection E1. The second interconnection E2 may penetrate the capping layer 135. The upper surface of the second interconnection E2 may be positioned at the same level as the upper surface of the capping layer 135. The second interconnection E2 may be formed simultaneously with a metal interconnection ML, which will be described later. The second interconnection E2 may be formed separately from the metal interconnection ML. The structure of the second interconnection E2 may be positioned at the same as that of the metal interconnection ML. The material of the second interconnection E2 may be the same as that of the metal interconnection ML.

Subsequently, the first peripheral region P1 will be described.

The first peripheral region P1 may include a transistor. The transistor may include a peripheral active region 104P, a gate structure PG over the peripheral active region 104P, gate spacers 125 formed on both sidewalls of the gate structure PG, and peripheral source/drain regions PSDs formed in the peripheral active region 104P to be aligned on both sides of the gate structure PG. The peripheral source/drain regions PSDs may be doped with an N-type impurity or a P-type impurity.

The gate structure PG may include a gate dielectric layer 120 formed over the peripheral active region 104P, a lower gate electrode 121 over the gate dielectric layer 120, a peripheral barrier layer 122 over the lower gate electrode 121, an upper gate electrode 123 over the peripheral barrier layer 122, and a gate hard mask 124 over the upper gate electrode 123. The gate structure PG may include a stack of a gate dielectric layer 120, a lower gate electrode 121, peripheral barrier layer 122, and an upper gate electrode 123. According to an embodiment of the present invention, the gate structure PG may be a planar gate.

The gate dielectric layer 120 may be positioned over the substrate 101. The gate dielectric layer 120 may include high-k materials, an oxide, a nitride, an oxynitride, or a combination thereof.

The lower gate electrode 121 may be formed over the gate dielectric layer 120. The lower gate electrode 121 may include polysilicon. According to another embodiment of the present invention, the lower gate electrode 121 may be formed of a metal-containing material.

The peripheral barrier layer 122 may be positioned over the lower gate electrode 121. The height of the peripheral barrier layer 122 may be lower than the height of the lower gate electrode 121. The peripheral barrier layer 122 may include titanium nitride (TiN).

The upper gate electrode 123 may be positioned over the peripheral barrier layer 122. The upper gate electrode 123 may include a metal, a metal nitride, a metal silicide, or a combination thereof. The upper gate electrode 123 may include tungsten (W) or a tungsten compound.

The gate hard mask 124 may be positioned over the upper gate electrode 123. The gate hard mask 124 may include a material having an etch selectivity with respect to the upper gate electrode 123. The height of the gate hard mask 124 may be greater than the height of the upper gate electrode 123. The gate hard mask 124 may include silicon oxide, silicon nitride, silicon oxynitride, or a combination thereof.

The gate spacers 125 may be positioned on both sidewalls of the gate structure PG. The gate spacers 125 may be formed of a dielectric material. The gate spacers 125 may include an oxide or a nitride. The gate spacers 125 may include multi-layer spacers. The gate spacers 125 may include an air gap.

A low-level inter-layer dielectric layer 130 covering the gate structure PG and the gate spacers 125 may be formed. The low-level inter-layer dielectric layer 130 may include a dielectric material. The height of the low-level inter-layer dielectric layer 130 may be the same as the height of the gate structure PG.

Peripheral source/drain regions PSD may be coupled to the low-level metal interconnection 129 through the low-level contact plug 128. The low-level contact plug 128 may penetrate the low-level inter-layer dielectric layer 130. A peripheral ohmic contact layer 126 and a conductive liner 127 may be formed between the low-level contact plug 128 and the peripheral source/drain region PSD.

The peripheral ohmic contact layer 126 may be formed over the substrate 101. The peripheral ohmic contact layer 126 may include a metal silicide. The conductive liner 127 may be formed over the sidewall of the low-level inter-layer dielectric layer 130 and the peripheral ohmic contact layer 126. The conductive liner 127 may include titanium nitride and may be optionally omitted. A low-level contact plug 128 may be formed over the conductive liner 127. The low-level contact plug 128 may penetrate the low-level inter-layer dielectric layer 130 to be coupled to the peripheral source/drain regions PSDs. The upper surface of the low-level contact plug 128 may be positioned at the same level as the upper surface of the low-level inter-layer dielectric layer 130. The low-level contact plug 128 may include a metal, a metal nitride, a metal silicide, or a combination thereof. The low-level contact plug 128 may include tungsten (W) or a tungsten compound.

A low-level metal interconnection 129 may be formed over the low-level contact plug 128. The low-level metal interconnection 129 may be coupled to the peripheral source/drain region PSD through the low-level contact plug 128 and the peripheral ohmic contact layer 126. The low-level metal interconnection 129 may include a metal-containing material. The low-level metal interconnection 129 may include one selected among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), molybdenum (Mo) and combinations thereof.

The lower capping layer 131 may fill a space between the low-level metal interconnections 129. The lower capping layer 131 may cover a sidewall portion of the low-level metal interconnection 129. The height of the lower capping layer 131 may be positioned at the same height of the low-level metal interconnection 129. The lower capping layer 131 may include a dielectric material. The lower capping layer 131 may include silicon nitride.

The etch stop layer 132 may be formed over the lower capping layer 131 and the low-level metal interconnection 129. The etch stop layer 132 may include a nitrogen-containing material.

The inter-layer dielectric layer 133 may be formed over the etch stop layer 132. The height of the inter-layer dielectric layer 133 may be greater than the height of the low-level inter-layer dielectric layer 130. The inter-layer dielectric layer 133 may include a single layer or a stacked structure of a plurality of layers. The inter-layer dielectric layer 133 may include an oxide, a nitride, or a combination thereof. The inter-layer dielectric layer 133 may include TEOS.

The contact hole hard mask 134 may be formed over the inter-layer dielectric layer 133.

The contact plug CP penetrating the contact hole hard mask 134, the inter-layer dielectric layer 133, and the etch stop layer 132 may be formed. The contact plug CP may directly contact the upper surface of the low-level metal interconnection 129. Accordingly, the contact plug CP may be electrically connected to the low-level metal interconnection 129. The contact plug CP may include a metal, a metal nitride, a metal silicide, or a combination thereof. The contact plug CP may include tungsten (W) or a tungsten compound. Although not illustrated, the contact plug CP may further include an ohmic contact layer over the low-level metal interconnection 129, and a conductive liner surrounding the sidewall and bottom surfaces of the contact plug CP over the ohmic contact layer.

The capping layer 135 may be formed over the contact hole hard mask 134. The capping layer 135 may cover the contact hole hard mask 134. The thickness of the capping layer 135 may be greater than the thickness of the contact hole hard mask 134.

The capping layer 135 may include an oxygen-containing material. The capping layer 135 may include an oxide. The capping layer 135 may include silicon oxide. The capping layer 135 may include only an oxide. The capping layer 135 may be formed of an oxide. The capping layer 135 may not contain a nitride. The capping layer 135 may be nitride-free.

The metal interconnection ML may be formed over the contact plug CP. The metal interconnection ML may extend in a line shape. A sidewall of the metal interconnection ML may directly contact the capping layer 135. The upper surface of the metal interconnection ML may be positioned at the same level as the upper surface of the capping layer 135. The height of the metal interconnection ML may be greater than the height of the low-level metal interconnection 129.

The metal interconnection ML may include one or more selected among Al, Au, Be, Bi, Co, Cu, Hf, In, Mn, Mo, Ni, Pb, Pd, Pt, Rh, Re, Ru, Ta, Te, Ti, W, Zn and Zr. The metal interconnection ML may include one or a stacked structure of two or more. According to an embodiment of the present invention, the metal interconnection ML may include copper (Cu). The metal interconnection ML may include the same structure as the second interconnection E2. The metal interconnection ML may include the same material as the second interconnection E2.

The contact plug CP and the metal interconnection ML may be referred to as a 'metal interconnection structure'. Although this embodiment shows one 'metal interconnection structure', according to another embodiment of the present invention, two or more 'metal interconnection structures' may be stacked. In other words, one or more 'metal interconnection structures' may be formed.

Subsequently, the second peripheral region P2 will be described.

A through electrode TSV may be formed to be spaced apart from the metal interconnection ML and extend into the substrate 101. The through electrode TSV may penetrate the low-level inter-layer dielectric layer 130, the lower capping layer 131, the etch stop layer 132, the inter-layer dielectric layer 133, the contact hole hard mask 134, and the capping layer 135. A depth of the through electrode TSV extending into the substrate 101 may be greater than a depth of the isolation layer 103 of the first peripheral region P1. According to another embodiment of the present invention, the through electrode TSV may penetrate the substrate 101. The upper surface of the through electrode TSV may be positioned at the same level as the upper surface of the capping layer 135. Accordingly, the upper surfaces of the through electrode TSV, the metal interconnection ML, and the capping layer 135 may be positioned at the same level.

The through electrode TSV may include a material such as the metal interconnection ML. Through electrode TSV may include one or more selected among Al, Au, Be, Bi, Co, Cu, Hf, In, Mn, Mo, Ni, Pb, Pd, Pt, Rh, Re, Ru, Ta, Te, Ti, W, Zn, and Zr. The through electrode TSV may include one or a stacked structure of two or more. According to an embodiment of the present invention, the through electrode TSV may include copper (Cu).

A dielectric liner 140 may be formed between the through electrode TSV and the substrate 101. The dielectric liner 140 may extend between the through electrode TSV and the capping layer 135. According to another embodiment of the present invention, the dielectric liner 140 may cover only the sidewall of the through electrode TSV and may not cover the bottom surface of the through electrode TSV. The dielectric liner 140 may include a dielectric material. The dielectric liner 140 may include an oxide, a nitride, or a combination thereof. The dielectric liner 140 may include silicon oxide, silicon nitride, silicon oxynitride, or a combination thereof. According to another embodiment of the present invention, the metal interconnection ML or the second interconnection E2 may also include the dielectric liner 140.

Although not illustrated, a barrier layer (not shown) may be selectively formed between the dielectric liner 140 and the through electrode TSV. The barrier layer (not shown) may surround the sidewall and bottom surface of the through electrode TSV. The barrier layer (not shown) may be a single layer or a laminate of two or more. The barrier layer (not shown) may include a metal-containing material. The barrier layer (not shown) may include a metal material or a metal compound. The barrier layer (not shown) may include a material such as Ta, TaN, Ti, TiN, Ru, Co, Ni, NiB, or WN. According to another embodiment of the present invention, the metal interconnection ML or the second interconnection E2 may also include a barrier layer.

In the semiconductor device 100 according to an embodiment of the present invention, since the capping layer 135 is positioned between the metal interconnections ML, RC delay may be improved and process defects such as ion migration may be reduced. Accordingly, the characteristics of the semiconductor device may be improved.

According to an embodiment of the present invention, process defects may be reduced by forming a capping layer of an oxide, thereby improving the characteristics of a semiconductor device.

According to an embodiment of the present invention, ion migration defects of metal interconnection may be improved by forming a capping layer of an oxide.

According to an embodiment of the present invention, process stability may be secured by simultaneously forming metal interconnection and a through electrode, and the yield may be improved by simplifying the process.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a contact plug that penetrates an inter-layer dielectric layer over a substrate;
   forming a capping layer over the inter-layer dielectric layer and the contact plug;
   forming a trench that exposes an upper surface of the contact plug by etching the capping layer;
   forming a sacrificial layer that fills the trench over the capping layer;
   forming a through hole that penetrates the inter-layer dielectric layer, the capping layer, and the sacrificial layer and extends into the substrate;
   removing the sacrificial layer to expose the trench;
   forming a metal interconnection in the trench; and
   forming a through electrode in the through hole.

2. The method of claim 1, wherein the capping layer is formed of an oxide.

3. The method of claim 1, wherein the sacrificial layer includes one selected among Spin-On-Carbon (SOC) and hard mask carbon.

4. The method of claim 1, wherein the contact plug includes tungsten (W).

5. The method of claim 1, wherein the metal interconnection and the through electrode include copper (Cu).

6. The method of claim 1, wherein the metal interconnection and the through electrode are formed simultaneously.

7. The method of claim 1, further comprising:
   forming one or more lower metal interconnection structures over the substrate, before the forming of the contact plug.

8. The method of claim 7, wherein the lower metal interconnection structures include
   a low-level contact plug over the substrate, and a low-level metal interconnection over the low-level contact plug.

9. The method of claim 1, further comprising:
   forming a gate structure over the substrate, before the forming of the contact plug that penetrates the inter-layer dielectric layer over the substrate.

* * * * *